US006314182B1

(12) United States Patent
Brandt

(10) Patent No.: US 6,314,182 B1
(45) Date of Patent: Nov. 6, 2001

(54) EXTERNAL FILTER BOX

(75) Inventor: Konrad W Brandt, Wedel (DE)

(73) Assignee: 3M Innovative Properties Company, St. Paul, MN (US)

( * ) Notice: Subject to any disclaimer, the term of this patent is extended or adjusted under 35 U.S.C. 154(b) by 0 days.

(21) Appl. No.: 09/136,662

(22) Filed: Aug. 19, 1998

(51) Int. Cl.⁷ .............................. H04M 9/00; H03H 7/02

(52) U.S. Cl. .......................... 379/412; 439/610; 333/185; 333/202

(58) Field of Search ................ 379/412, 413.02–413.04, 379/414; 439/98, 108, 608, 610, 620; 333/182, 185, 202, 203

(56) References Cited

U.S. PATENT DOCUMENTS

| | | | |
|---|---|---|---|
| 4,218,580 | 8/1980 | Pound et al. | 174/107 |
| 4,405,187 | 9/1983 | Muller et al. | 339/14 |
| 4,647,122 | 3/1987 | Kelly | 339/14 |
| 5,170,101 | 12/1992 | Aldissi | 174/36 |
| 5,313,017 | 5/1994 | Aldissi | 174/36 |
| 5,575,667 | 11/1996 | Mehez et al. | 439/98 |
| 5,659,152 | 8/1997 | Horie et al. | 174/113 |
| 5,838,216 * | 11/1998 | White et al. | 439/620 |
| 6,165,018 * | 12/2000 | Arnett et al. | 439/620 |

FOREIGN PATENT DOCUMENTS

| | | | |
|---|---|---|---|
| 36 24 571 A1 | 7/1986 | (DE) | H01R/13/658 |
| 38 08 330 A1 | 3/1988 | (DE) | H01R/13/658 |
| 40 41 374 A1 | 12/1990 | (DE) | H01B/11/04 |
| 42 44 225 A1 | 12/1992 | (DE) | H01R/13/658 |
| 0 041 595 A1 | 3/1981 | (EP) | H01R/13/658 |
| 0 190 939 A2 | 2/1986 | (EP) | H01B/11/14 |
| 0 317 116 A1 | 11/1988 | (EP) | H01R/13/719 |
| 0 339 802 A2 | 3/1989 | (EP) | H01R/13/658 |
| 0 366 956 A1 | 10/1989 | (EP) | H01R/13/719 |
| 0 382 148 A2 | 2/1990 | (EP) | H01R/13/719 |
| 0 410 769 A1 | 7/1990 | (EP) | H01R/13/719 |
| 0 596 869 A2 | 4/1991 | (EP) | H01B/11/10 |
| 0 467 400 A1 | 7/1991 | (EP) | H01R/13/658 |
| 0 601 327 A2 | 10/1993 | (EP) | H01R/13/719 |
| 7326229 | 12/1995 | (JP) | H01B/11/06 |
| 8321220 | 3/1996 | (JP) | H01B/11/06 |
| 9259655 | 3/1997 | (JP) | H01B/11/04 |
| 9199238 | 7/1997 | (JP) | H01R/13/719 |

* cited by examiner

*Primary Examiner*—Wing Fu Chan
(74) *Attorney, Agent, or Firm*—Matthew B. McNutt; Yen Tong Florczak

(57) ABSTRACT

An assembly includes a connector having a plurality of contacts, a plurality of electrical filters arranged outside the connector, a first cable bundle and a second cable bundle. The first cable bundle includes a plurality of cables, each cable making electrical connection between a corresponding one of the plurality of contacts of the connector and a corresponding one of the plurality of electrical filters. The second cable bundle includes a plurality of cables making electrical connection to a corresponding one of the plurality of filters. The plurality of electrical filters is preferably arranged in a separate housing which may be spaced from the connector.

24 Claims, 7 Drawing Sheets

EXTERNAL FILTER BOX

FIELD OF THE INVENTION

The present invention relates to a system for connecting a multiplicity of cables to an electronic device. The system provides electromagnetic compatibility (EMC) which is typically required in the telecommunication field for the reduction of electromagnetic interference. The cables used with the system are preferably of the twisted pair type commonly used for telecommunication signal transmission.

BACKGROUND OF THE INVENTION

The technical advances occurring in the field of electronics, and more particularly in the telecommunication field, increasingly requires the connection of a multiplicity of cables to all kinds of electronic equipment. In the case of high-frequency or high-bit rate data transmission, fiber-optic cables and coaxial cables are used. Specific connector systems have been developed for these fiber-optic and coaxial cables which allow the connection of a multiplicity of cables. On the other hand, there is also a broad field in which the frequencies and bit-rate transmissions are lower. Primarily for cost reasons, the cables which are used for lower frequencies and lower bit-rate transmissions are neither of the fiber-optic type nor of the coaxial type, which means that the cables are not individually shielded in some way. However to provide some electromagnetic compatibility, these "low speed" cables are formed into so-called "twisted pairs" which provide a minimum of electronic shielding. Such electronic shielding is supposed to prevent an electronic shielding is supposed to prevent an interaction between the individual communication lines {known as cross-talk), as well as interaction between the cable and the outside environment (typically referred to as electromagnetic compatibility).

When using twisted pair cables, a multiplicity of cables are typically brought into the form of a bundle of cables which has a common outer sheath. To meet the requirements for the necessary electromagnetic compatibility, one possibility is to make the outer sheath a common electromagnetic shield for the entire bundle of cables. Such systems for connecting the multiplicity of cables to electronic equipment then include such a shielded bundle which is connected to a connector having a multiplicity of contacts. Such cable assemblies and connectors are well known and are described, for example, in the German Offenlegungsschrift DE 42 44 225 and the European Patent Application EP 0 041 595.

Another possibility for meeting the electro-magnetic compatibility requirements is to utilize cables where the conductor is surrounded by an insulation layer which itself provides a contribution to the shielding. This can be achieved, for example, by adding ferrite particles to the insulation layer as described in U.S. Pat. Nos. 5,170,010 and 5,313,017. Alternatively, the insulating layer may consist of a material that has a relatively high dielectric constant (e.g., more than 4) as described in the European Patent Application EP 0 190 939. Yet another alternative is to give the insulation layer a high magnetic permeability as referred to in the German Offenlegungsschrift DE 40 41 374 or to build in an electrically conductive resin layer using carbon fibers as described in the European Patent Application EP 0 596 896.

A certain level of electromagnetic shielding can generally be obtained by simply twisting the signal conductor and the ground conductor around each other (thereby giving rise to the term "twisted pair cable"). The twisted pairs can, for example be bundled together and provided with a common shield as it can be seen in the U.S. Pat. No. 4,218,580.

A number of variations for twisted pair cables can be devised. One possibility is to have two signal conductors and one ground conductor, with the three conductors being twisted around each other as referred to in the Japanese Patent Application JP 7-326 229.

Another possibility is described in the references JP 9-259 655, JP 8-321 220 and U.S. Pat. No. 5,659,152. In all these references, bundles of twisted pair cables are used in which the individual twisted pairs have different pitches. It has been shown that through these configurations it is possible to reduce the cross-talk and to meet certain levels of the above mentioned standards for electromagnetic compatibility.

Although special cables having specific dielectric or twisted pair configurations with a complex geometrical structure may provide the needed electro-magnetic compatibility, the use of such special cables is not generally acceptable. Specifically, such special cables typically have either a high material cost or their somewhat complicated configuration does not allow the utilization of these cables in great quantities and without a specific adjustments. Thus, the general practice is to operate with standardized twisted pair cables having a simple configuration, and bringing multiple cables into a bundle of cables which, however, is not additionally protected with an outer conductive shield.

Therefore, as a possible solution to provide the necessary electro-magnetic compatibility another approach has been taken. Specifically, it has become common to utilize additional electrical or electronic filters to reduce cross-talk and signal noise. The filters are typically passive filters comprising at least a capacitor, and preferably a combination of capacitors and inductors. Currently, these filters are known to be built into the cable connectors. This can, for example, be seen from the German Offenlegungsschrift DE 36 24 571, the European Patent Application EP 0 467 400 and the European Patent Application EP 0 366 965. Typically, these filters are built into the contact pin configuration of the connector. EP 0 366 965 shows a somewhat more advanced configuration in which the contact pin 50 (see FIG. 5) is surrounded with three cylindrical components, the middle component providing an inductor, the two outer components having the form of a concentric capacitor. The inner electrode of this concentric capacitor is electrically and mechanically connected to the central pin, while the outer electrodes are connected to the common ground of the entire connector system into which the filter is built. Typically, filters with this configuration are inserted into a holder (see FIG. 2) which allows the connection to a common electrical ground.

The connectors with built in filters are also described in the European Patent Applications EP 0 410 5 769, EP 0 339 802, EP 0 601 327 and EP 0 382 148, the German Offenlegungsschrift DE 38 08 330 and the Japanese Patent Application JP 9-199 238. In all these cases, the general construction is more or less as described above utilizing essentially cylindrical capacitors.

Connector configurations which utilize built-in filters, however, have disadvantages. In particular, a certain minimum spacing between the contact pins of the connector must be maintained, as the capacitors which are assembled onto the contact pins require additional space. This is, for example, particularly critical when higher currents (e.g., on the order of several amps) have to be transmitted (such as for the power supplies of high-power fluorescent lamps which are driven with higher frequencies), and where simultaneously electro-magnetic compatibility is required. Therefore, connectors with built-in filters cannot be utilized when a miniaturized connector is required. Furthermore, connectors with built-in filters are typically pre-designed and pre-assembled and, therefore do not allow for any modification of the built-in filters. Thus, it is necessary to build different connectors for each different electrical requirement. Building different connectors for each different electrical requirement is clearly not practical given the almost limitless variations of capacities and inductances which may be needed.

On the other hand, the utilization of filters offers a relatively simple way to meet the requirements for electro-magnetic compatibility as compared to the above-described alternative solutions. An additional possibility would be to build the filters into the electronic equipment itself. This, however, can require a sophisticated and cumbersome design, as a shielded compartment within the electrical equipment may be necessary to prevent interaction between the filter configuration and the remainder of the equipment. Furthermore, the equipment would not necessarily be standardized, as different types of filter systems may be needed for different applications of the same piece of electronic equipment.

As can clearly be seen, there exists a need for a new and improved system for the connection of a multiplicity of cables, preferably of the twisted pair type, to an electronic device. In particular, there is a need for a system which allows the utilization of narrow-pitch connectors, and as well as the ability to simply and easily select from a variety of filters configurations.

SUMMARY OF THE INVENTION

The present invention provides a new and improved system for connecting multiple cables to electronic equipment using narrow-pitch connectors, and which offers the capability to easily adapt a variety filters configurations.

The invention solves the above-described problems with existing connection systems by separating the electrical filters from the connector, and preferably by bringing these filters into a housing separate from the connector. An assembly according to the invention comprises a connector which has a plurality of contacts. There are many possible connector configurations which are well known to those skilled in the art. A plurality of electrical filters are arranged outside the connector, and in the most general configuration each individual filter has a first pair of electrical connection points and a second pair of electrical connection points. For the completion of the assembly, a first cable bundle is used which comprises a plurality of cables. Each of the individual cables has a first and a second end, and the first end of the individual cables terminates at a respective one of the plurality of contacts of the connector, while the second end of the individual cable is by some means electrically connectable to the first pair of connection points of a respective one of the plurality of the filters. Furthermore, a second cable bundle comprising a plurality of cables is used where each of the individual cables of the second cable bundle is electrically connectable to the second pair of the connection points of the respective one of the plurality of filters. A large variety of embodiments will be recognized by those skilled in the art, all of them following the same principle.

The filters themselves can be of the type generally used for meeting the electro-magnetic compatibility requirements. The filters may typically consist of passive elements, such as capacitors, inductors and resistors, as described above. However, the filters also may comprise active elements, either in the form of individual transistors and the like or integrated circuits that have been built according to specific requirements. In the most general configuration, the filters have a first pair of electrical connection points serving as an input and being electrically connected to the first cable bundle and a second pair of electrical connection points serving as an output being connected to the second cable bundle. In specific configurations it may be possible to link these two pairs together so that the cables of the first cable bundle and the cables of the second cable bundle are connected to the same pair of connection points. Preferably one of the points is connected to the common electrical ground level.

The individual cables of the cable bundle are preferably of the twisted pair type consisting of two wires, where the first wire is the signal wire and the second wire is connected ground and thus provides the electrical shielding. Typically, the ground wires of each twisted pair cable in the bundle are connected to a common ground.

The plurality of electrical filters are preferably placed into a housing of some kind. However, other ways of protecting the electrical filters could be devised. For example, the filters could be protected by a tube that is arranged around the filters. Such a tube could be shrunk down around the filters by generally known methods, such as by the application of heat or by other well known methods which do not require heating. If such a tube were used, grounding could be provided by placing a conductive non-woven jacket around the filters prior to the shrinking of the tube.

The filter housing or the corresponding protective means can be either immediately adjacent to the housing of the connector or in other preferred configurations may be separated from the connector by a certain distance so that the housing for the filters is linked with the connector through the first cable bundle. The housing for the filters can consist, for example of plastic material or metal. If the housing is metal, the filters can be grounded through the metal housing. If the housing is made of a plastic material, a metal coating or other means may be provided to allow grounding of the filters. In such a configuration, the conductive housing would be connected to the ground level. In the case of the use of twisted pair cables, the ground wires are connected to the ground level, preferably directly through the filter housing.

The first cable bundle linking the filter housing to the connector housing is preferably provided with a protective sheath. This sheath may be made conductive using generally known methods. Such a conductive sheath would then be connected to the ground level. When using such a protective sheath, it may be desired to provide at least one end of the sheath with means for strain relief. This can be easily done by methods known to those skilled in the art.

When placing the electrical filters into the filter housing, different techniques can be used. A preferred approach is to arrange the filters on a printed circuit board, and to utilize printed circuit board connectors onto which the individual cables of the first and second cable bundles may be connected. Alternatively, it may also be advantageous to arrange the electrical filters individually within the filter housing. If the filter housing is electrically grounded, then all the individual filters are connected to the ground level.

The second cable bundle is connected to the filters, preferably within the filter housing. Furthermore, like the first cable bundle, the second cable bundle may be protected with an external sheath. The protective sheath could in certain cases be shielded and connected to ground. However, in many instances it may be desirable for cost reasons to provide the second cable bundle just with a protective plastic sleeve. While the first cable bundle typically has a relatively short length, for example on the order of 1 meter, the second bundle has a length which could vary widely and which could well be in the range of 10— 100 m. The far end of the second cable bundle is then connected to whatever equipment is necessary, such as a communication line, etc.

BRIEF DESCRIPTION OF THE DRAWINGS

The invention described herein will be best understood from the accompanying drawings which present the preferred embodiments of the invention. The invention, however, is not limited thereto, but only defined by the claims.

FIGS. 1–4 show the details of an electrical filter as known in the prior art, while

FIG. 1 is a prior art filter configuration to be used within connectors.

FIG. 2 is a cross-sectional view of the filter according to FIG. 1.

FIG. 3 is a cross-sectional view of a connector with two rows of contacts.

FIG. 4 is a diagram of the specific electrical circuit of the filter of FIG. 1.

FIG. 5 is a schematic cross-sectional view of a first embodiment of an assembly according to the invention with a filter housing adjacent to the connector and the use of twisted-pair cables.

FIG. 6 is a schematic cross-sectional view of a second embodiment of an assembly according to the invention with a filter housing spaced from the connector and the use of twisted-pair cables.

FIG. 7 is a third embodiment of an assembly according to the invention which is identical to the one of FIG. 6 with, however, the use of single wire cables.

FIG. 8 is a cross-sectional view of a fourth embodiment of an assembly according to the invention where the electrical filters are individually arranged within the filter housing.

FIG. 9 is a side view of an assembly according to the invention.

DETAILED DESCRIPTION OF THE PREFERRED EMBODIMENTS

Figure 1:
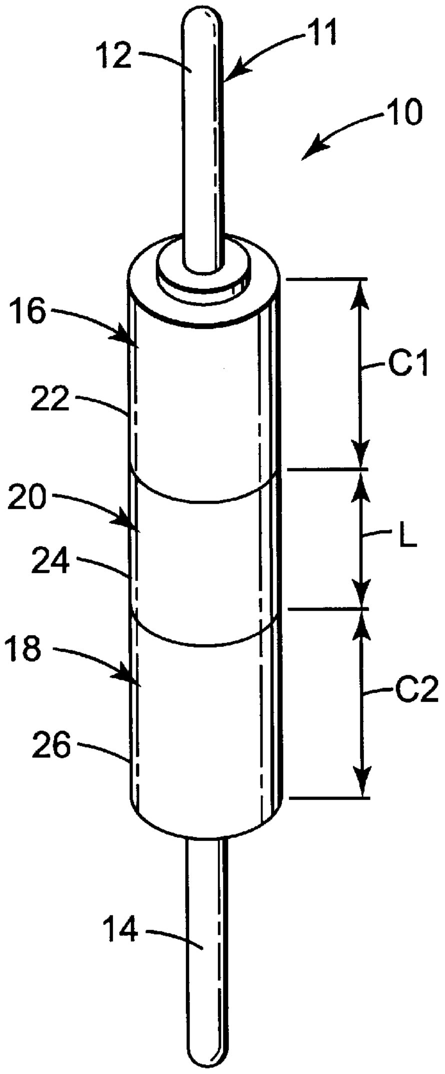

FIG. 1 shows an electrical filter unit 10 to be used within a filter connector. Filter 10 is constructed around a pin 11 with two connecting portions 12 and 14. One of connecting portions 12, 14 serves as the pin to be inserted into the receptacle into which the entire connector is to be inserted, while the other connecting portion is used for connection to a cable end (typically by soldering). A configuration of capacitors 16 and 18 is arranged onto pin 11 with an inductor 20 between them. The outer surfaces 22, 26 of the two capacitors 16, 18 are electrically conductive, while the outer surface 24 of the inductor 20 may be insulating.

Figure 2:
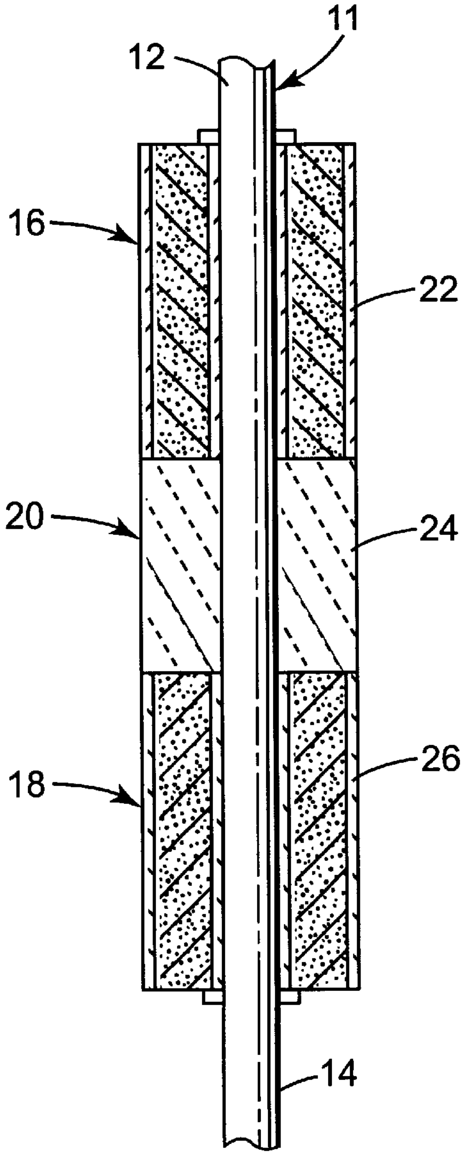

The construction of filter 10 can be better understood from FIG. 2, where capacitors 16, 18 and inductor 20 are shown in cross-sectional view. Capacitors 16, 18 have the form of a cylinder, with one electrode forming the inner surface of the cylinder (which is in direct electrical contact with the conductive pin 11), while the outer surfaces 22, 26 form second conductive electrodes. A dielectric material is arranged between the electrodes. Inductor 20 is positioned between capacitors 16, 18.

Figure 3:
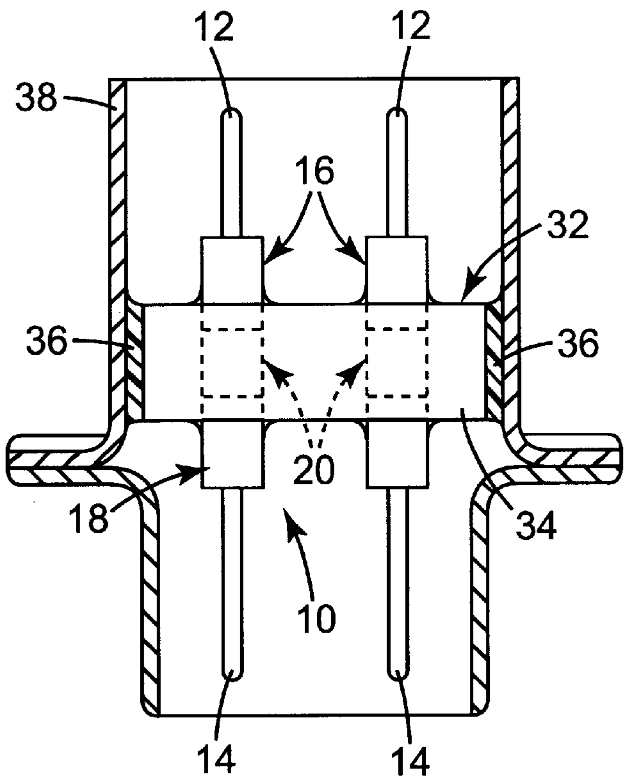

FIG. 3 shows a connector 30 into which two rows of filter units 10 are incorporated. The same reference numerals as in FIG. 1 and FIG. 2 are used here for the sake of clarity. The two rows of filters 10 are inserted into a connector body 34 which correspondingly is provided with holes for receiving filter units 10. The surfaces 32 of body 34 are conductive, while the inner portion of body 34 consists of an insulating material. The filter units 10 are preferably soldered into the holes of connector body 34 so that the conductive external surfaces 22, 26 of capacitors 16, 18 are in electrical contact with the conductive surface 32 of body 34. The body 34 with multiple filters 10 is then glued and soldered through the layer 36 onto the metal housing 38 of the connector 30. Throughout this process, care is taken to ensure that the inductors 20 are not in electrical contact with the connector housing 38.

Figure 4:
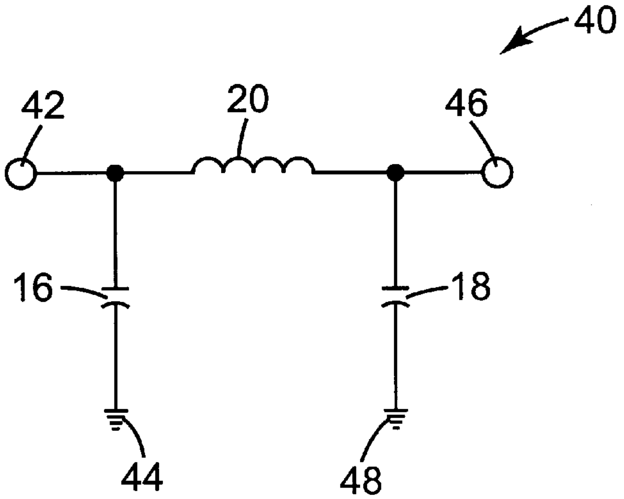

FIG. 4 illustrates the electrical circuit of a filter 10 having capacitors 16, 18 and inductor 20. The electrical connection points 42, 46 may correspond to the connecting portions 12, 14 of pin 11 in the preceding figures. As described above, the outer surfaces 22, 24 of capacitors 16, 18 form second electrodes which are grounded through the housing 38 (depicted with the grounding symbols 44 and 48 in FIG. 4). In a more general aspect there is a first pair of connection points 42, 44 and a second pair of connection points 46, 48, and in the most general sense any filter in principle has these two pairs of connection points which must be connected appropriately.

In the specific example given, the filter 10 consists of two capacitors 16, 18 and one inductor 20. However, alternatives to the described filter also exist. For example, it is possible to utilize a only single capacitor, while relying on the inductance which is inherently present in an such an electrical system to provide the needed inductance. It is also possible to use active filters, rather than the passive filters which have been described. Many kinds of active elements could be used, such as transistors or integrated circuits. Thus, references to filters or electrical filters in the description of the invention should be understood in the most general sense, as designs of both passive and active filters are contemplated.

FIGS. 5–9 describe certain preferred embodiments according to the invention. However, the described embodiments should not be considered limiting, as those skilled in the art will recognize additional variations of the invention which embody the spirit of the invention.

Figure 5:
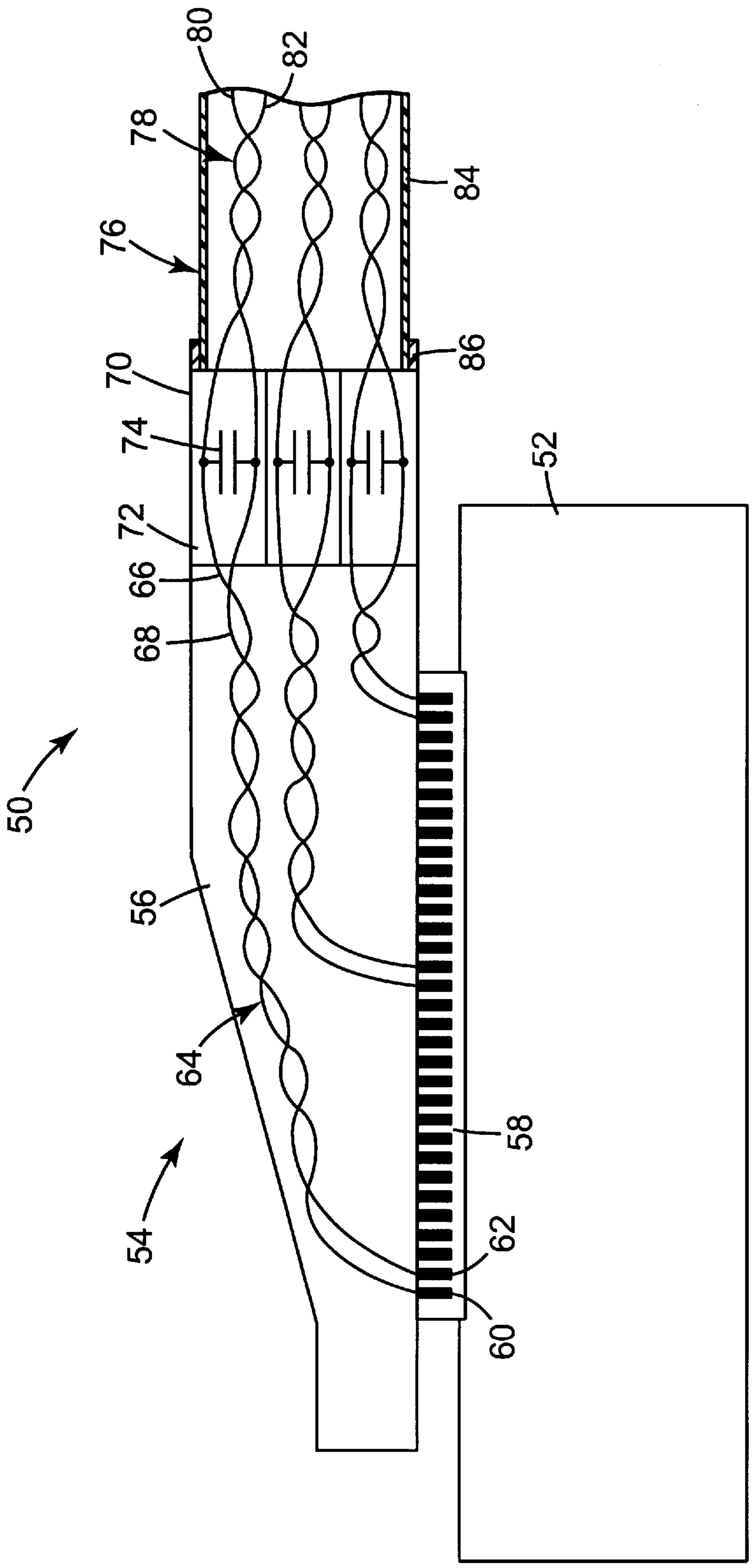
FIGS. 5–9 show preferred embodiments according to the invention.

FIG. 5 shows a first assembly 50 according to the invention. The assembly is connected to a piece of electronic equipment 52, which may be a telecommunication control unit or any other electronic device onto which external cables have to be connected. Although the electronic equipment may be designed to connect to multiple connectors and associated cable bundles, for the sake of simplicity only a single connector system is shown here.

A connector 54 with a housing 56 is connected to the electronic equipment 52 through an array 58 of contacts. For the sake of simplicity, it is not shown in detail that connector 54 is provided with a plurality of contacts and that the electronic equipment 52 is provided with a corresponding array of receptacles. Contacts and receptacles are shown in a simplified manner as pairs 60, 62 of contact configurations.

Further, for the sake of simplicity only a relatively small number of contact pairs 60, 62 are shown. Connector 54 may have a relatively large number of contact counts such as 16, 32, 64, or more. Each of the plurality of contacts 60, 62 within the connector is connected to a corresponding one of a plurality of cables 64 using generally known connection techniques. In this case the cables 64 are of the twisted pair type and comprise a signal wire 66 and a ground wire 68. Of course, other types of cables 64 may be used. For example, cables 64 may also be single signal wires, coaxial cables, or other types of cables known in the art. Only three cables 64 are shown in FIG. 5, although in reality the number of cables 64 is typically significantly larger as mentioned above, e.g. 16, 32, 64 or more cables.

Immediately adjacent the lateral end of the housing 56 of the connector 54, a second housing 70 is arranged into which a plurality of filters 72 are placed. In the illustrated configuration, filters 72 include a single capacitor 74. In this specific case, filters 72 are arranged side by side and the connection of the twisted pair cables 64 with their individual wires 66, 68 is achieved through well known methods, e.g. by soldering or other connection techniques. The connector housing 56 and filter housing 70 are joined together by suitable means, such as adhesive, ultrasonic welding, or other means readily identifiable by one skilled in the art. Accordingly, it is necessary to provide filter housing 70 with a first opening so that cables 64 can be guided from connector housing 56 into filter housing 70.

The multiplicity of the individual cables 64 extending between contacts 60, 62 and filters 72 form a first cable bundle which will be referred to in more detail below. On the opposite side of filter housing 70 a second opening is provided through which a second cable bundle 76 is connected. Second cable bundle 76 consists of a multiplicity of individual cables 78, which in this case are also of the twisted pair cable type having a signal wire 80 and a ground wire 82. Second cable bundle 78 is provided with an external sheath 84 which provides second cable bundle 78 the necessary mechanical protection. The entire cable bundle 78, including the end of the sheath 84, is attached to filter housing 70 by some strain relief means 86. The individual signal wires 80 and ground wires 82 of twisted pair cables 78 are connected onto filters 72 using the same means used to connect individual wires 66, 68 of twisted pair cables 64 of the first cable bundle to contacts 60, 62 and filters 72.

Second cable bundle 76 has a length which is determined by the specific application requirements and which is typically in the range of several meters, often in the range of 10–100 meters. The second end of second cable bundle 76 is then connected in a similar manner to another piece of electronic equipment, such as a control unit, a telecommunication distribution unit or the like. The second end of second cable bundle 76 may utilize a similar filter configuration.

Figure 6:
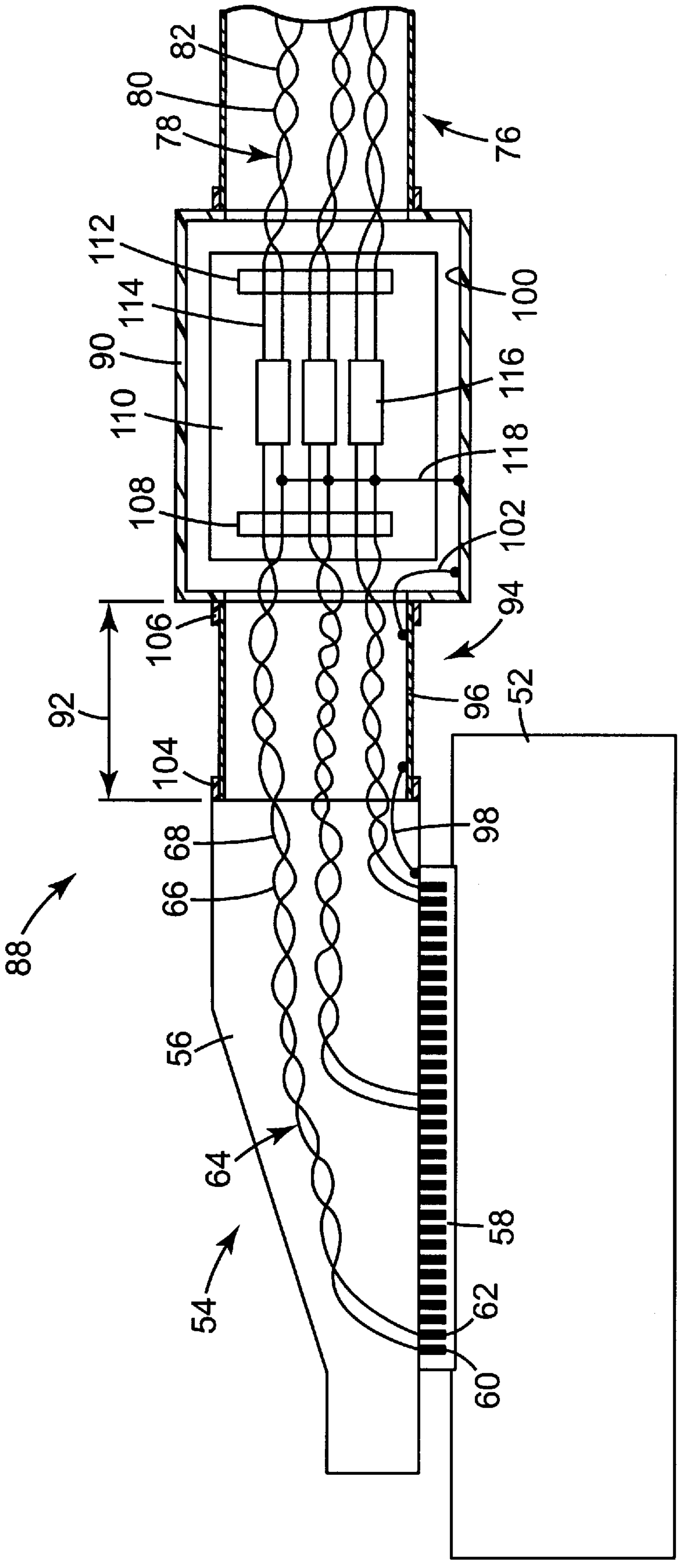

FIG. 6 shows a second embodiment 88 of the invention. The electronic equipment 52, the connector 54 with its housing 56, and the connection means to the electronic equipment 58 with contacts 60, 62, showing only a selection of three cables 64 of the twisted pair type are the same as in described in reference to FIG. 5.

The embodiment of FIG. 6 differs from the embodiment of FIG. 5 in the configuration and arrangement of the filter housing 90. Filter housing 90 is spaced from connector 54 by a distance 92. Accordingly, the individual cables 64 have a greater length according to the distance between connector 54 and filter housing 90. The plurality of cables 64 form a distinctive separate first cable bundle 94. Only three of cables 64 are shown, although in actuality more cables 64 would be present. The cable bundle 94 is surrounded by a sheath 96 which includes a conductive layer and thus provides additional electrical shielding. The shield of sheath 96 is connected to ground within the connector 54 by appropriate means 98. At least at its inner surface, filter housing 90 is given a conductive surface 100 which is connected to the conductive sheath 96 of the first cable bundle 94 through appropriate means 102. The cable bundle 94, including sheath 96, is guided into both the connector housing 56 and the filter housing 90 where by strain relief means 104, 106 are provided. The second cable bundle 76 is identical to that described in reference to FIG. 5.

Within the filter housing 90, individual cables 64 are guided to a connector 108 which itself is mounted by appropriate means onto a printed circuit board 110. The individual wires 66, 69 of twisted pair cables 64 are connected to the printed circuit board connector 108 by techniques which are well known those skilled in the art. An identical configuration is arranged on the opposite side of filter housing 90 adjacent the entrance of second cable bundle 76. Individual wires 80, 82 of cables 78 are connected to a second printed circuit board connector 112. On the printed circuit board, conductive paths 114 are arranged which establish a connection between the printed circuit board connectors 108, 112 and the electrical filters 116 which are mounted on the printed circuit board by means typically used in this technology. The filters 116 may be of any of the type as described above, and may contain passive elements only or as an alternative also comprise active elements. Furthermore, the ground conductors connected to the ground wires 68, 82 are connected to the conductive inner surface 100 of filter housing 90 by generally known means 118.

Figure 7:
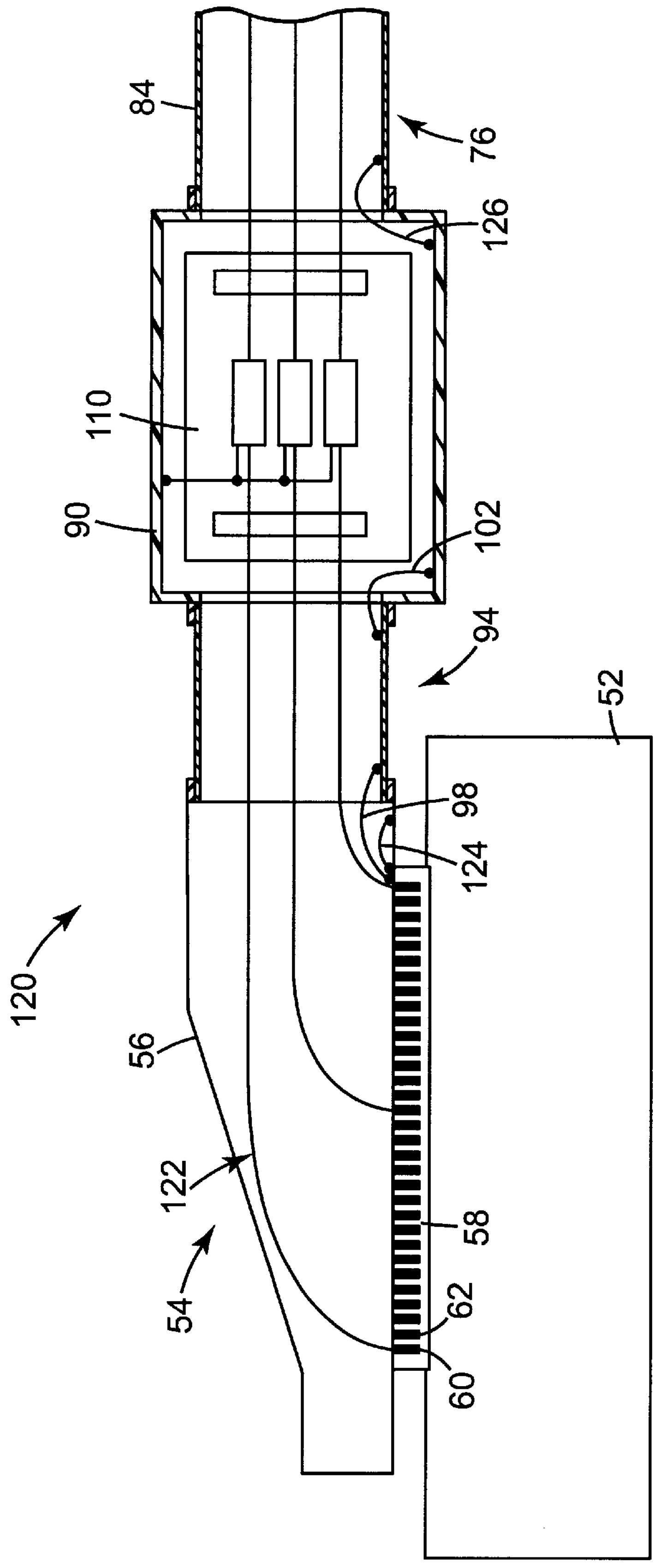

FIG. 7 shows a third embodiment 120 of the invention. The embodiment of FIG. 7 differs from the embodiment shown in FIG. 6 in that only single signal wires 122 are used as individual cables within the bundle 94 (e.g., twisted pair cables are not used). The electronic equipment 52 is identical to that described above, while connector 54 has a housing which is provided with an electrical shield. Filter housing 90 with circuit board 110 is the same as described with reference to FIG. 6, while the second cable bundle 76 is provided with an outer sheath 84 which is electrically conductive and as such serves as a shield. It is ensured that all shields are interconnected by appropriate means 98, 102, 124, 126.

Figure 8:
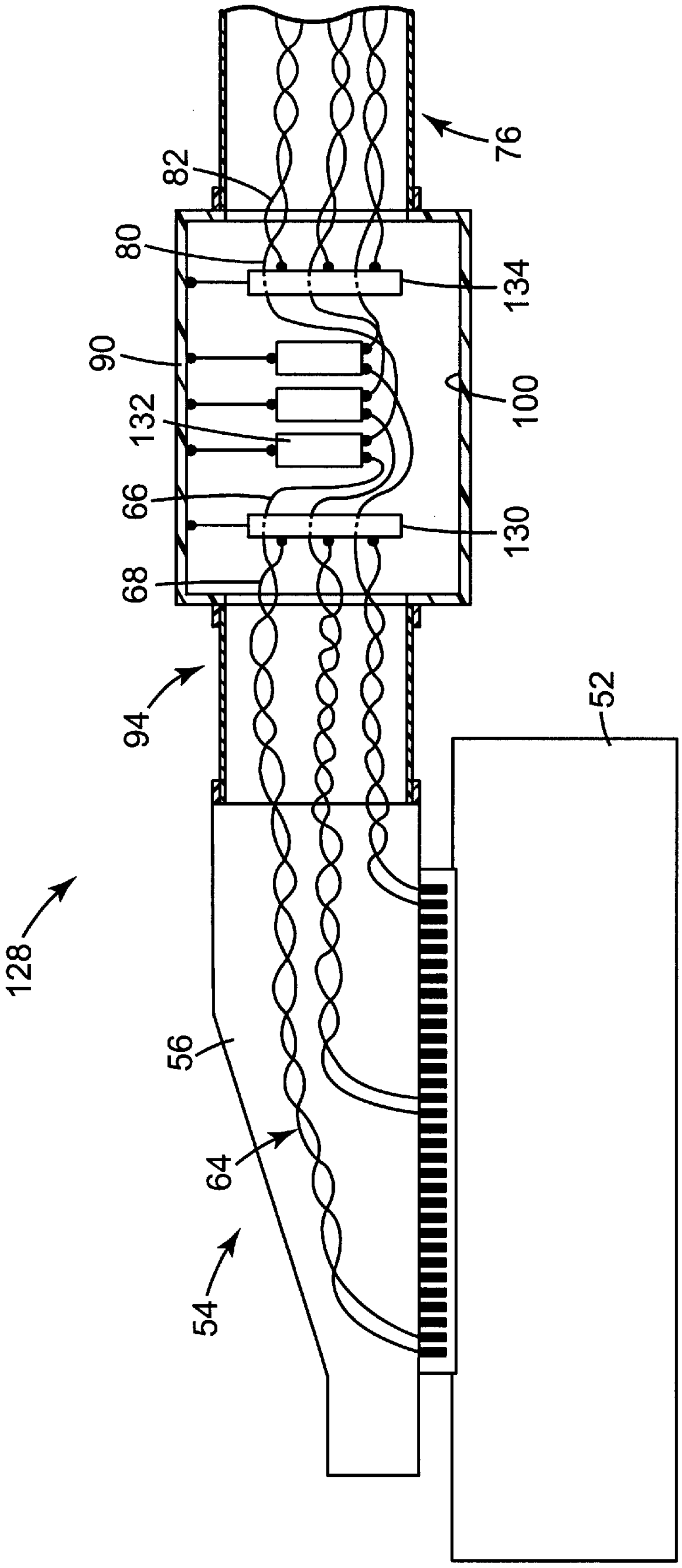

FIG. 8 shows a fourth embodiment 128 which is distinctive from the second embodiment as shown in FIG. 6 by the arrangement and configuration of the filters. The electronic equipment 52, the connector 54, the first cable bundle 94, the filter housing 90 and the second cable bundle 76 are essentially identical to the corresponding components of the second embodiment as shown in FIG. 6. The distinctive difference is in the arrangement of the connectors and filters within the filter housing 90, all of these components being connected to ground to the internal surface 100 of the housing. The ground wires 68 of the twisted pair individual cables 64 of the first cable bundle 94 are connected to a first connector 130 which provides electrical connection to the conductive inner part of the housing 100, thereby connecting wires 68 to a common ground. The signal wires 66 pass through and are directly connected to the filters 132. In the same manner, ground wires 82 and signal wires 80 of second cable bundle 76 are connected to filters 132. Specifically, ground wires 82 are connected to a second connector 134 which, like first connector 130, is electrically connected to the conductive part 100 of housing 90. Signal wires 80 are connected to the corresponding one of electrical filters 132. Both signal wires 66, 80 can be jointly connected to the corresponding one of filters 132.

Figure 9:
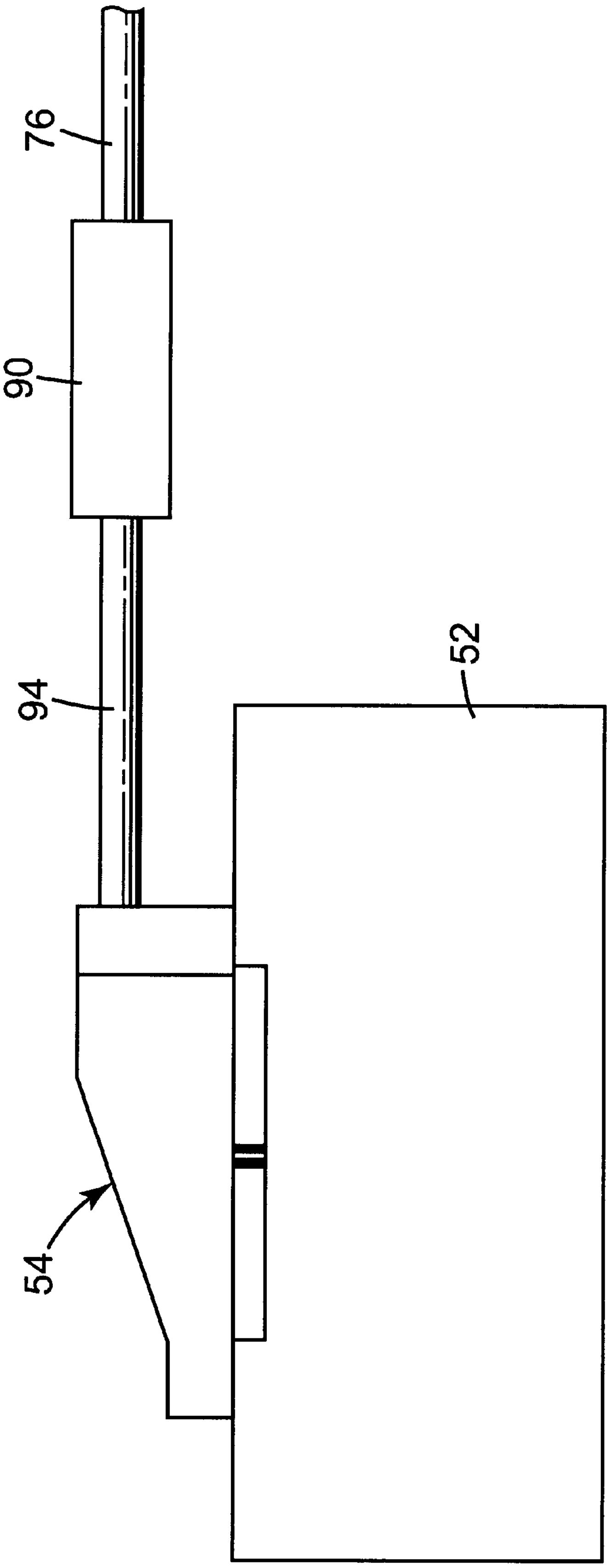

FIG. 9 provides an external side view of the second through fourth embodiments 88, 120, 128 showing electronic equipment 52, connector 54, first cable bundle 94 which is preferably shielded, filter housing 90 and second cable bundle 76. FIG. 9 depicts more clearly one essential advantage of the invention. Specifically, connector housing 54 can be made as small as possible which is a significant advantage. A small connector housing 54 is possible because the filters in filter housing 90 are located away from connector housing 54. Because connector housing 54 and filter housing 90 are connected through first cable bundle 94 (which is flexible), there is freedom to position the filter housing at an acceptable distance and position from connector housing 54. It is not necessary to leave filter housing 90 in a position as depicted in FIG. 9. Filter housing 90 can, for example, be spaced apart from connector housing 54 by a distance of 1–2 meters and could have a geometrical arrangement in any desired direction. A further advantage is the fact that connector and filter housing are completely separate units. They can be manufactured independently and a certain selection of connectors 54 on one side and a certain collection of filter configurations within the filter housings 90 on the other side could be used and would allow a relatively large number of configurations depending on the specific requirements with respect to the electro-magnetic compatibility.

What is claimed is:

1. An assembly comprising:

a connector having a plurality of contacts within a connector housing;

a plurality of electrical filters arranged outside the connector housing, wherein each of the plurality of filters has a first electrical connection point and a second electrical connection point;

a first cable bundle comprising a plurality of cables, each of the plurality of cables having a first and a second end, wherein the first end of each of the individual cables of the first cable bundle terminates at a respective one of the plurality of contacts of the connector and the second end of each individual cable is electrically connectable to the first connection point of a respective one of the plurality of filters; and a second cable bundle comprising a plurality of cables, each of the plurality of cables having a first and a second end, wherein each of the plurality of cables of the second cable bundle is electrically connectable to the second connection point of a respective one of the plurality of filters.

2. The assembly of claim 1, wherein the electrical filters are passive elements.

3. The assembly of claim 1, wherein the electrical filters are active elements.

4. The assembly of claim 1, wherein the first electrical connection point of each of the electrical filters comprises a first pair of electrical connection points, and the second electrical connection point comprises a second pair of electrical connection points.

5. The assembly of claim 1, wherein the electrical filters are arranged in a filter housing.

6. The assembly of claim 5, wherein the filter housing is adjacent to the connector housing.

7. The assembly of claim 5, wherein the filter housing is spaced from the connector housing and whereby the filter housing and the connector housing are linked together by the first cable bundle.

8. The assembly of claim 7, wherein the first cable bundle is provided with an external protective sheath.

9. The assembly of claim 8, wherein the sheath is electrically shielded.

10. The assembly of claim 8, wherein at least one end of the sheath is provided with strain relief.

11. The assembly of claim 5, wherein the filter housing includes an electrical shield which is electrically connected to ground potential.

12. The assembly of claim 1, wherein each of the plurality of cables of the first and second cable bundles consist of a pair of twisted wires.

13. The assembly of claim 12, wherein each pair of twisted wires includes a signed wire and a ground wire, and wherein the ground wire of the twisted pair is connected to the electrical shield of the filter housing.

14. The assembly of claim 5, wherein the electrical filters are arranged on a printed circuit board.

15. The assembly of claim 14, wherein each of the second ends of the plurality of cables of the first cable bundle terminate at a printed circuit board connector.

16. The assembly of claim 14, wherein each of the plurality of cables of the second cable bundle terminate at a printed circuit board connector.

17. The assembly of claim 5, wherein the second cable bundle is provided with an external protective sheath.

18. The assembly of claim 17, wherein the external sheath includes an electrical shield.

19. The assembly of claim 18, wherein the shield is electrically connected to ground potential.

20. The assembly of claim 17, wherein the second cable bundle connects to the filter housing and is provided with strain relief.

21. The assembly of claim 1, wherein each of the plurality of cables of the first and second cable bundle consist of a pair of twisted wires, wherein one of the wires is electrically connected to ground potential.

22. The assembly of claim 1, wherein each of the plurality of cables of the first and second cable bundles consist of a ground wire and a signal wire.

23. The assembly of claim 1, wherein each of the plurality of cables of the first and second cable bundles consist of a coaxial cable.

24. The assembly of claim 1, wherein each of the plurality of cables of the first and second cable bundles consist of a signal wire.

* * * * *

UNITED STATES PATENT AND TRADEMARK OFFICE

CERTIFICATE OF CORRECTION

PATENT NO. : 6,314,182 B1
DATED : November 6, 2001
INVENTOR(S) : Brandt, Konrad

It is certified that error appears in the above-identified patent and that said Letters Patent is hereby corrected as shown below:

Column 2,
Line 55, delete "5".

Signed and Sealed this

Twentieth Day of August, 2002

*Attest:*

JAMES E. ROGAN

*Attesting Officer*

*Director of the United States Patent and Trademark Office*